US010124694B2

(12) United States Patent
Yang et al.

(10) Patent No.: US 10,124,694 B2
(45) Date of Patent: Nov. 13, 2018

(54) BATTERY MANAGEMENT APPARATUS

(71) Applicant: ALEEES ECO ARK (CAYMAN) CO. LTD., Grand Cayman (KY)

(72) Inventors: An-Tao Anthony Yang, Taoyuan (TW); Gordon Ching Chen, Taoyuan (TW)

(73) Assignee: ALEEES ECO ARK CO. LTD., Bade (TW)

( * ) Notice: Subject to any disclaimer, the term of this patent is extended or adjusted under 35 U.S.C. 154(b) by 50 days.

(21) Appl. No.: 15/127,487

(22) PCT Filed: Mar. 20, 2015

(86) PCT No.: PCT/CN2015/074807
§ 371 (c)(1),
(2) Date: Sep. 20, 2016

(87) PCT Pub. No.: WO2015/139664
PCT Pub. Date: Sep. 24, 2015

(65) Prior Publication Data
US 2017/0182908 A1     Jun. 29, 2017

Related U.S. Application Data

(60) Provisional application No. 61/968,848, filed on Mar. 21, 2014.

(51) Int. Cl.
*B60L 11/18* (2006.01)
*H02J 7/00* (2006.01)
*G01R 31/36* (2006.01)

(52) U.S. Cl.
CPC ....... *B60L 11/1864* (2013.01); *B60L 11/1809* (2013.01); *B60L 11/1861* (2013.01);
(Continued)

(58) Field of Classification Search
CPC . H02J 7/0021; B60L 11/1809; B60L 11/1861; B60L 11/1864; G01R 31/3679; G01R 31/3648
See application file for complete search history.

(56) References Cited

U.S. PATENT DOCUMENTS 5,349,535 A     9/1994  Gupta
6,399,238 B1 *  6/2002  Oweis ................. H01M 2/1077
                                                    429/100
(Continued)

FOREIGN PATENT DOCUMENTS

CN     101667665 A    3/2010
CN     101834457 A    9/2010
(Continued)

*Primary Examiner* — Helen Rossoshek
(74) *Attorney, Agent, or Firm* — Kirton McConkie; Evan R. Witt

(57) ABSTRACT

A battery management apparatus is provided. The battery management apparatus is used for increasing the capability of controlling the quality of battery modules and increasing the system integration. The battery management apparatus includes an interchangeable battery module and a battery pack management unit. The interchangeable battery module includes a battery management unit, a relay and a battery cell package. The battery management unit includes a voltage measurement circuit and a memory circuit. The voltage measurement circuit and the memory circuit are insulated from each other. The relay is used for switching an internal circuit of the interchangeable battery module. The battery cell package is connected with the battery management unit, and serves as a power source of the battery management apparatus. The battery pack management unit is connected with the voltage measurement circuit of the interchangeable battery module. The voltage measurement circuit is powered by the battery cell package. The voltage measurement circuit issues voltage information to the battery pack management
(Continued)

unit. A battery operation data is stored in the memory circuit. The memory circuit is only accessible by the battery pack management unit through a memory input/output connector.

6 Claims, 3 Drawing Sheets

(52) U.S. Cl.
CPC ..... *G01R 31/3648* (2013.01); *G01R 31/3679* (2013.01); *H02J 7/0014* (2013.01); *H02J 7/0021* (2013.01); *Y02T 10/7055* (2013.01)

(56) References Cited

U.S. PATENT DOCUMENTS

| | | | | |
|---|---|---|---|---|
| 6,741,065 B1* | 5/2004 | Ishii | ........... | B60L 11/1816 320/122 |
| 8,547,065 B2* | 10/2013 | Trigiani | ........... | H02J 7/0018 320/118 |
| 8,878,492 B2* | 11/2014 | Furukawa | ........... | H01M 10/425 307/48 |
| 9,056,556 B1* | 6/2015 | Hyde | ........... | B60L 11/1851 |
| 9,331,497 B2* | 5/2016 | Beaston | ........... | H01M 10/4207 |
| 9,876,367 B2* | 1/2018 | Trigiani | ........... | H02J 7/0014 |
| 2007/0236173 A1 | 10/2007 | Kimura | | |
| 2013/0046495 A1 | 2/2013 | Sim | | |
| 2014/0277887 A1* | 9/2014 | Slattery | ........... | B60L 1/003 701/22 |
| 2014/0339891 A1 | 11/2014 | Ohkawa | | |
| 2015/0239365 A1* | 8/2015 | Hyde | ........... | B60L 11/1861 701/2 |
| 2016/0134106 A1* | 5/2016 | Despesse | ........... | H01M 2/0245 307/77 |
| 2016/0272083 A1* | 9/2016 | Dai | ........... | B60L 11/1864 |
| 2016/0272085 A1* | 9/2016 | Dai | ........... | H01M 10/6566 |

FOREIGN PATENT DOCUMENTS

| | | | |
|---|---|---|---|
| CN | 202142877 U | | 2/2012 |
| CN | 102377207 A | | 3/2012 |
| CN | 203246337 U | | 10/2013 |
| CN | 203339779 U | * | 12/2013 |
| JP | 2000215919 A | | 8/2000 |
| JP | 2013059237 A | | 3/2013 |
| TW | 201301716 A | | 1/2013 |
| TW | 201319796 A | | 5/2013 |
| TW | 201351839 A | | 12/2013 |
| WO | 2012132177 A1 | | 10/2012 |
| WO | 2013094057 A1 | | 6/2013 |

* cited by examiner

BATTERY MANAGEMENT APPARATUS

FIELD OF THE INVENTION

The present invention relates to a battery management apparatus, and more particularly to a battery management apparatus that utilizes plural battery modules having independent and segregated memory circuits.

BACKGROUND OF THE INVENTION

Nowadays, electric vehicles start to replace fossil fuel vehicles. In addition, electric vehicles are gradually applied to the public transportation field. One of many feasible methods of implementing the electric-powered system to the public transportation vehicles is to use swappable battery packs and battery swap stations. For example, the battery packs in the battery swap stations are fully charged at first. When the battery pack of an electric bus is nearly depleted, the electric bus stops at a specified battery swap station. Then, the depleted battery pack of the electric bus and the fully-charged battery pack of the battery swap station are exchanged with each other within 5 to 10 minutes. Consequently, the electric bus can acquire sufficient electric power from the fully-charged battery pack to be continuously driven.

In practice, each battery cell in a battery module of the battery pack degrades at different rates during its service time. Moreover, the capacity of each battery module inevitably deteriorates after the third year of the service time. The deterioration of the battery capacity causes a mileage reduction up to about thirty percent. For allowing the battery pack to discharge electricity uniformly, all battery modules of the battery pack have to be kept at a similar capacity range and at a similar internal resistance range. Regardless of the age of battery module, any degraded battery module of the battery pack needs to be replaced with the new one. For realizing the status of the battery module, it is necessary for the battery pack provider to frequently test the battery module. After the capacity of the battery module is predicted and the status of the battery pack is realized, the battery pack provider can provide good service to the electric bus agency and the electric taxi agency.

Conventionally, the battery module is retested in a specialized facility. After the battery module is retested, it is necessary to download and transfer the operation data, the SOH (state of health) data, the SOC (state of charge) and the usage histories of the substituted battery module or the newly-installed battery module from a battery pack management unit or an electronic control unit (ECU). As known, this process is time-consuming and costly to the battery pack provider.

Moreover, when a fault event of the battery module occurs, a surge current generates. The surge current may destroy the battery cell and damage the battery management unit. Under this circumstance, the operation data of the battery module stored in the battery management unit are unrecoverable. That is, the user of the battery module cannot acquire the operation data of the battery module.

Therefore, there is a need of providing a battery management apparatus to overcome the drawbacks of the conventional technology such as the damage of the battery management unit from surge current, the unrecoverable operation data of the battery module and the time-consuming process of acquiring the state of the battery module.

SUMMARY OF THE INVENTION

An object of the present invention provides a battery management apparatus for providing reliable and efficient data transfer between an electronic control unit, a charging system and battery modules.

Another object of the present invention provides a battery management apparatus capable of recording the operation data and the usage histories of the battery module even if the electromechanical system of an electronic vehicle or the battery module malfunctions. Consequently, the battery service station can track the manufacturing defects and monitor the quality and performance of the leased battery module.

A further object of the present invention provides a battery management apparatus capable of individually providing the operation data and the usage histories of the battery modules to the battery service station and effectively comparing the operation data and the usage histories of the battery modules when the battery modules are charged. Consequently, the states of all battery modules are inspected.

In accordance with an aspect of the present invention, there is provided a battery management apparatus. The battery management apparatus includes an interchangeable battery module and a battery pack management unit. The interchangeable battery module includes a battery management unit, a relay and a battery cell package. The battery management unit includes a voltage measurement circuit and a memory circuit. The voltage measurement circuit and the memory circuit are insulated from each other. The relay is used for switching an internal circuit of the interchangeable battery module. The battery cell package is connected with the battery management unit, and serves as a power source of the battery management apparatus. The battery pack management unit is connected with the voltage measurement circuit of the interchangeable battery module. The voltage measurement circuit is powered by the battery cell package. The voltage measurement circuit issues a voltage information to the battery pack management unit. A battery operation data is stored in the memory circuit. The memory circuit is only accessible by the battery pack management unit through a memory input/output connector.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

Figure 1:
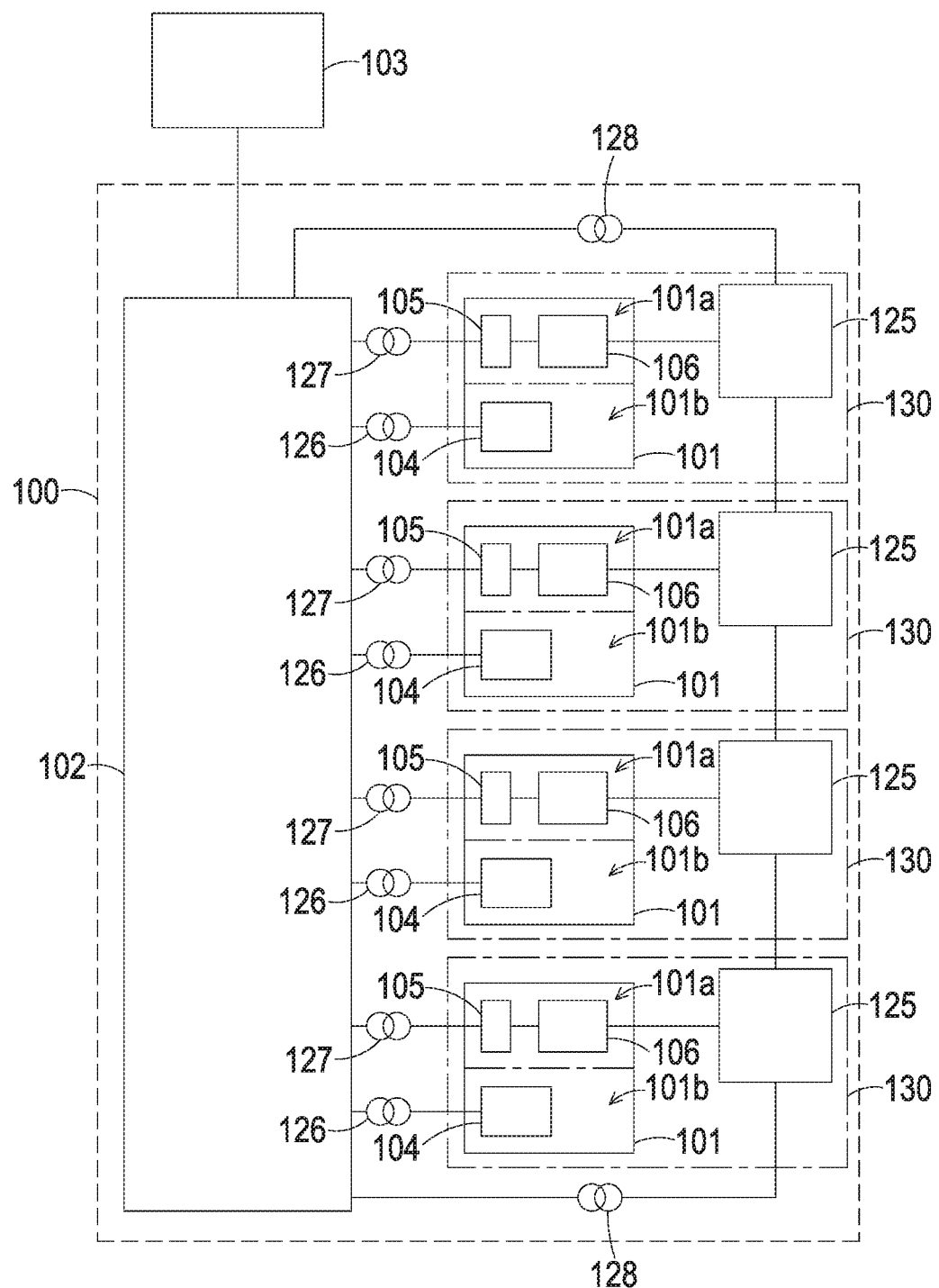
FIG. 1 schematically illustrates the architecture of a battery management apparatus for an electric vehicle according to an embodiment of the present invention.

FIG. 1 schematically illustrates the architecture of a battery management apparatus for an electric vehicle according to an embodiment of the present invention. As shown in the drawing, the battery management apparatus 100 comprises an outer shell (not shown), a battery pack management unit 102 and plural interchangeable battery modules 130. The outer shell (not shown) of the battery management apparatus 100 provides an accommodation space for accommodating the battery pack management unit 102 and plural interchangeable battery modules 130. Preferably but not exclusively, the battery management apparatus 100 is a battery pack. Each interchangeable battery module 130 comprises a battery cell package 125 and a battery management unit 101. In this embodiment, the battery management apparatus 100 comprises four interchangeable battery modules 130. It is noted that the number of the interchangeable battery modules 130 may be varied according to the practical requirements. The battery pack management unit 102 is connected with the battery management units 101, the positive relays 108 (see FIG. 2) and the negative relays (see FIG. 2) of the plural interchangeable battery modules 130. When the battery management apparatus 100 is connected with an electrical vehicle, the battery management apparatus 100 is connected with an electric control unit 103 of the electric vehicle through the battery pack management unit 102. Alternatively, when the battery management apparatus 100 is connected with a charging system 201 (see FIG. 3), the battery management apparatus 100 is connected with the charging system 201 through the battery pack management unit 102. The detailed connections between these components will be described later.

Please refer to FIG. 1 again. The battery cell package 125 of each interchangeable battery module 130 is connected with the corresponding battery management unit 101. Moreover, the battery cell package 125 is the electric power source of the interchangeable battery module 130. The battery management unit 101 comprises a voltage measurement circuit 106 and a memory circuit 104. The voltage measurement circuit 106 and the memory circuit 104 are insulated from each other. Preferably but not exclusively, the memory circuit 104 is a non-volatile memory circuit. The battery management unit further comprises an isolation circuit 105. Preferably but not exclusively, the isolation circuit 105 is an optocoupler. In this embodiment, the isolation circuit 105 is arranged between the battery pack management unit 102 and the voltage measurement circuit 106. Due to the isolation circuit 105, the battery pack management unit 102 and the voltage measurement circuit 106 are electrically insulated from each other. However, signals can be transmitted between the battery pack management unit 102 and the voltage measurement circuit 106. The memory circuit 104 is used for storing the operation data of the interchangeable battery module 130. Moreover, the memory circuit 104 is only accessible by the battery pack management unit 102. Consequently, the battery operation data and the usage histories of the interchangeable battery module 130 are continuously accumulated and stored by the memory circuit 104.

In this embodiment, each battery management unit 101 is further divided into a first section 101a and a second section 101b. The voltage measurement circuit 106 and the isolation circuit 105 of the battery management unit 101 are included in the first section 101a. The memory circuit 104 of the battery management unit 101 is individually included in the second section 101b. Since the first section 101a and the second section 101b are segregated and insulated from each other, the voltage measurement circuit 106 and the memory circuit 104 in the two different sections are also insulated from each other. The voltage measurement circuit 106 in the first section 101a is connected with the battery pack management unit 102 through the isolation circuit 105 and an instruction I/O connector 127. Consequently, the voltage information of the interchangeable battery module 130 is provided to the battery pack management unit 102. The voltage information is processed by the battery pack management unit 102 and converted into battery operation data, including the state of charge (SOC) information, the state of health (SOH) information, the cell temperature history information, the current usage information, the vehicle location history information, and so on. The memory circuit 104 in the second section 101b of the battery management unit 101 is connected with the battery pack management unit 102 through a memory I/O connector 126. The memory circuit 104 is connected with the battery pack management unit 102 only, but not connected with other circuits. Consequently, the memory circuit 104 is only accessible by the battery pack management unit 102 through the memory I/O connector 126. Moreover, the electric power for powering the voltage measurement circuit 106 in the first section 101a is provided by the battery cell package 125, and the electric power for powering the memory circuit 104 in the second section 101b is provided by a low voltage source (not shown) through the memory I/O connector 126.

The connection status of the battery management apparatus 100 used in the electric vehicle and the connection status of the battery management apparatus 100 in a charged mode will be illustrated as follows.

Figure 2:
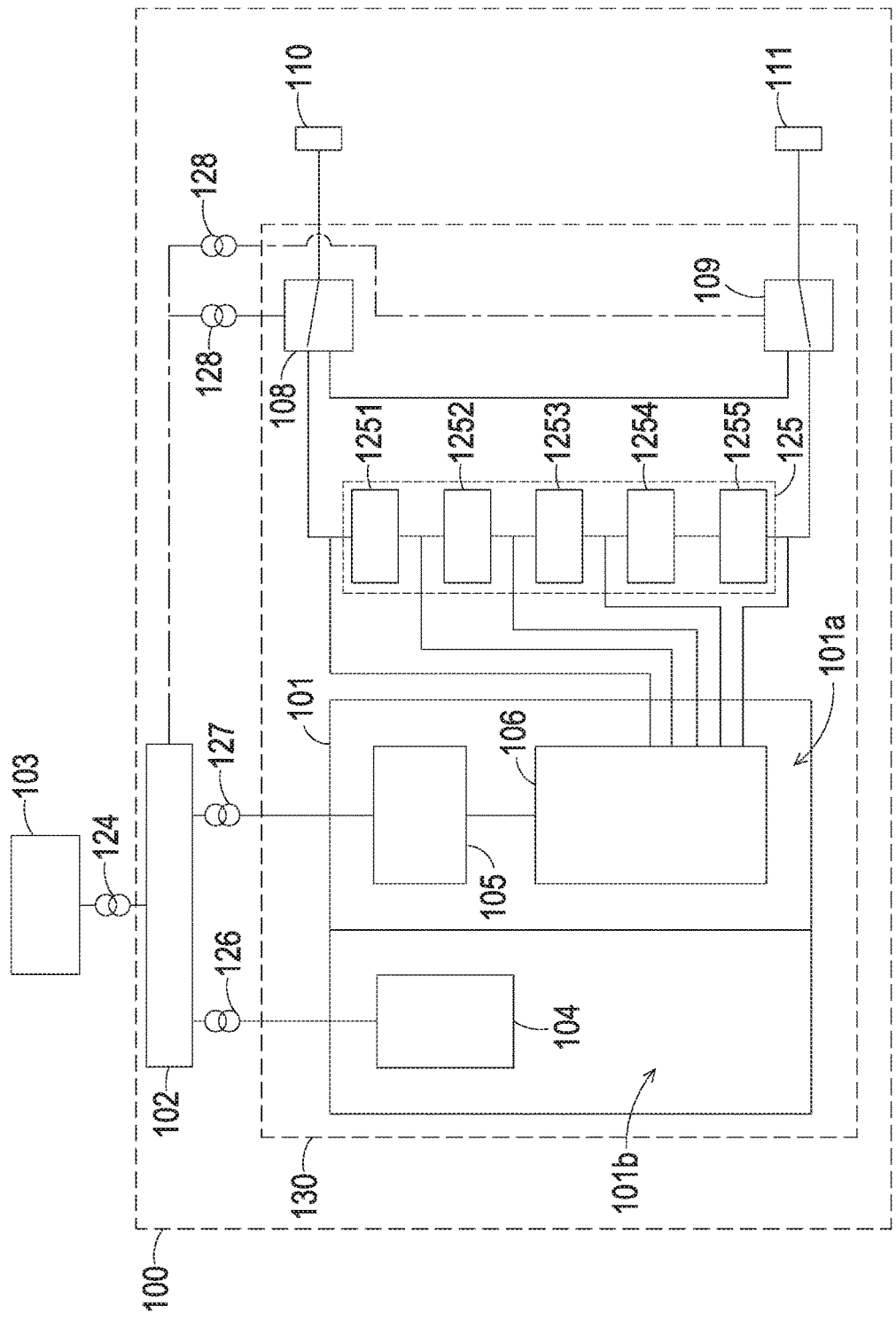
FIG. 2 schematically illustrates the detailed circuitry of the architecture of the battery management apparatus as shown in FIG. 1.

FIG. 2 schematically illustrates the detailed circuitry of the architecture of the battery management apparatus as shown in FIG. 1. As shown in FIG. 2, the battery management apparatus 100 comprises the battery pack management unit 102 and the plural interchangeable battery modules 130. For succinctness, only one interchangeable battery module 130 of the battery management apparatus 100 is shown in the drawing. It is noted that the number of the interchangeable battery modules 130 is not restricted. The interchangeable battery module 130 comprises the battery cell package 125, the battery management unit 101, the positive relay 108 and the negative relay 109. In this embodiment, the battery cell package 125 comprises plural battery cells 1251, 1252, 1253, 1254 and 1255 in order to provide electric energy to the interchangeable battery module 130. The number of the battery cells in the battery cell package 125 may be varied according to the practical requirements. That is, the number of the battery cells in the battery cell package 125 is not restricted. As mentioned above, the battery management unit 101 comprises the voltage measurement circuit 106, the isolation circuit 105 and the memory circuit 104. The battery management unit 101 is divided into the first section 101a and the second section 101b, which are segregated from each other. The voltage measurement circuit 106 and the isolation circuit 105 of the battery management unit 101 are included in the first section 101a. The memory circuit 104 of the battery management unit 101 is included in the second section 101b. Consequently, the voltage measurement circuit 106 and the memory circuit 104 are segregated and insulated from each other.

The positive relay 108 and the negative relay 109 are connected with a positive electrode and a negative electrode of the battery cell package 125, respectively. Preferably but not exclusively, the positive relay 108 is connected with the positive electrode of the battery cell 1251 of the battery cell package 125, and the negative relay 109 is connected with the negative electrode of the battery cell 1255 of the battery cell package 125. Consequently, the circuitry status of the interchangeable battery module 130 is controllable. In the battery management apparatus 100, the battery pack management unit 102 is connected with the positive relay 108 and the negative relay 109 through two relay control connectors 128. Consequently, the positive relay 108 and the negative relay 109 are controlled to be in a closed state or an open state. In this embodiment, the positive relay 108 and the negative relay 109 are further connected with a battery module positive electrode 110 and a battery module negative electrode 111, respectively. Consequently, the battery management apparatus 100 can be connected with the electric vehicle or the external power source (e.g., the charging system 201 as shown in FIG. 3) so as to provide electric power or receive electric power.

The relationships between the battery pack management unit 102 and associated components will be illustrated as follows. Please refer to FIG. 2 again. The battery pack management unit 102 is connected with the isolation circuit 105 and the voltage measurement circuit 106 in the battery management unit 101 of the interchangeable battery module 130 through the instruction I/O connector 127. Moreover, the isolation circuit 105 is arranged between the voltage measurement circuit 106 and the battery pack management unit 102. Due to the isolation circuit 105, the voltage measurement circuit 106 and the battery pack management unit 102 are electrically insulated from each other. However, signals can be transmitted between the voltage measurement circuit 106 and the battery pack management unit 102. The battery pack management unit 102 is connected with the memory circuit 104 in the battery management unit 101 of the interchangeable battery module 130 through the memory I/O connector 126. Moreover, the electric power for powering the memory circuit 104 is provided by a low voltage source (not shown) in the battery pack management unit 102. Moreover, the memory circuit 104 is only accessible by the battery pack management unit 102. As mentioned above, the battery pack management unit 102 is connected with the positive relay 108 and the negative relay 109 of the interchangeable battery module 130 through the two relay control connectors 128. Consequently, the battery pack management unit 102 can adjust the circuitry statuses of the positive relay 108 and the negative relay 109 through the relay control connectors 128. When the battery management apparatus 100 is connected with the electric vehicle, the battery pack management unit 102 is connected with the electric control unit 103 of the electric vehicle through a battery I/O connector 124. Consequently, the battery operation data and the usage histories of the interchangeable battery module 130 can be transmitted from the battery pack management unit 102 to the electric control unit 103.

When the battery management apparatus 100 of the present invention is applied to the electric vehicle, the battery pack management unit 102 continuously receives the voltage information from the voltage measurement circuit 106 of the battery management unit 101 through the instruction I/O connector 127. After the voltage information is processed, the battery pack management unit 102 acquires a series of battery operation data. Then, the battery pack management unit 102 stores the battery operation data into the memory circuit 104 through the memory I/O connector 126, or provides the battery operation data to the electric control unit 103 of the electric vehicle through a battery I/O connector 124. Moreover, the memory circuit 104 of the battery management unit 101 is an independent and insulated component that is included in the battery management unit 101 and externally powered. That is, the battery management unit 101 of the interchangeable battery module 130 cannot directly read or access the memory circuit 104. If the interchangeable battery module 130 has a malfunction, the generated surge current may only destroy the battery cell package 125 of the interchangeable battery module 130 and the voltage measurement circuit 106 in the first section 101a of the battery management unit 101. Since the first section 101a and the second section 101b of the battery management unit 101 are segregated. and insulated from each other, the memory circuit 104 in the second section 101b of the battery management unit 101 is not attacked by the surge current. Under this circumstance, the battery operation data stored in the memory circuit 104 are not lost. In other words, the memory circuit 104 has functions similar to a black box of an airplane.

Figure 3:
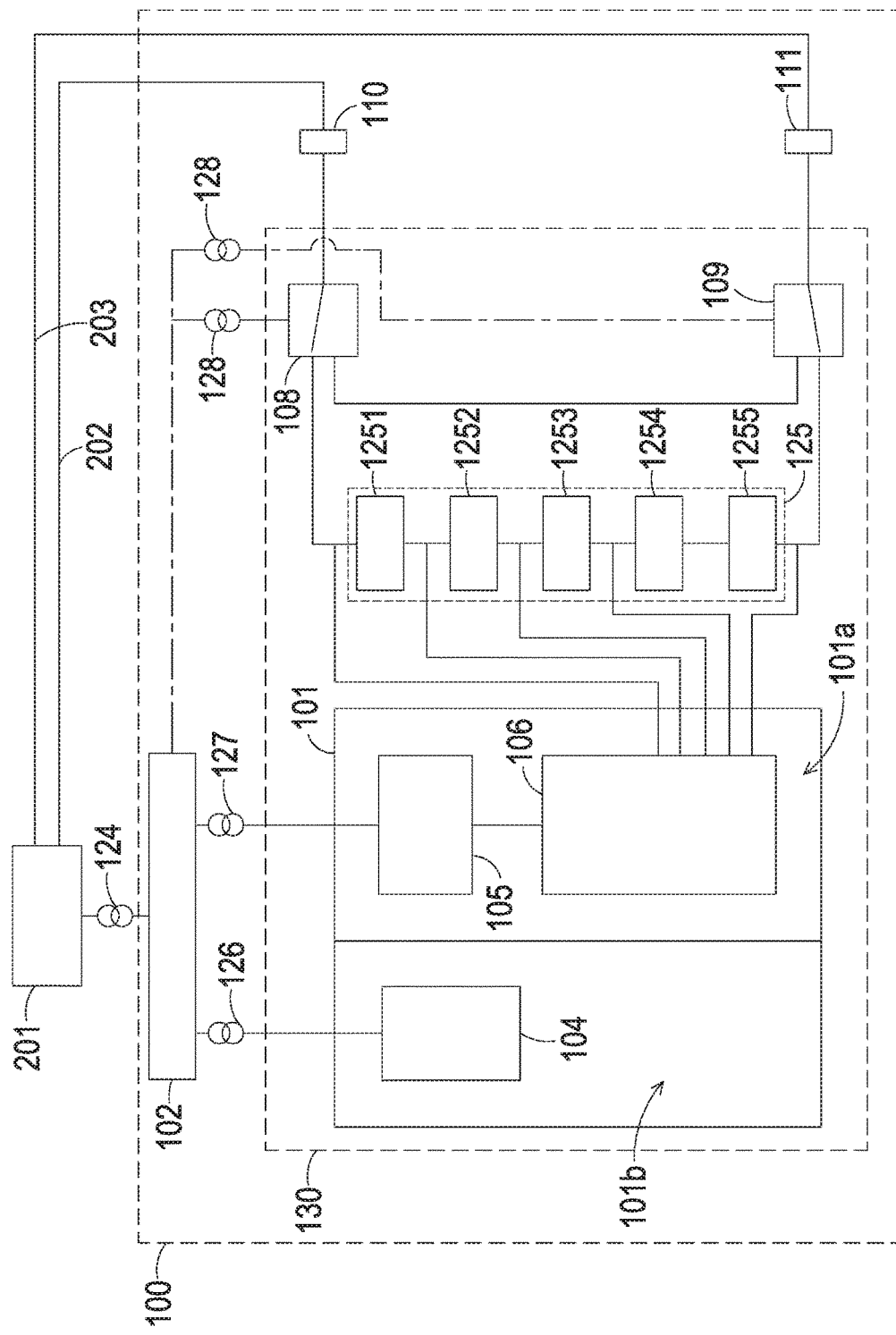
FIG. 3 schematically illustrates the detailed circuitry of the architecture of the battery management apparatus according to the embodiment of the present invention, in which the battery management apparatus is connected with a charging system.

FIG. 3 schematically illustrates the detailed circuitry of the architecture of the battery management apparatus according to the embodiment of the present invention, in which the battery management apparatus is connected with a charging system. The battery management apparatus 100 as shown in FIG. 2 is connected with the electric control unit 103 of the electric vehicle. Whereas, the battery management apparatus 100 as shown in FIG. 3 is connected with the charging system 201. Except for the following items, the architecture of the battery management apparatus 100 is similar to that mentioned above. Please refer to FIG. 3. During a charging operation, the battery pack management unit 102 is connected with the charging system 201 through the battery I/O connector 124. Consequently, the battery pack management unit 102 and the charging system 201 are in communication with each other. The charging system 201 further comprises a positive charging terminal 202 and a negative charging terminal 203. The positive charging terminal 202 and the negative charging terminal 203 are respectively connected with the battery module positive electrode 110 and the battery module negative electrode 111 of the battery management apparatus 100. Consequently, the interchangeable battery module 130 of the battery management apparatus 100 can be charged by the charging system 201. Since the battery operation data of the interchangeable battery module 130 is stored in the memory circuit 104 of the interchangeable battery module 130, the charging system 201 can directly read the battery operation data of the interchangeable battery module 130 through the battery pack management unit 102 of the battery management apparatus 100. Consequently, while the battery management apparatus 100 is being charged, the battery pack provider can test the electrical characteristics of all battery modules 130. By comparing the present electrical characteristics with the previous electrical characteristics, the statuses of all interchangeable battery modules 130 can be analyzed. Since the process of comparing the electrical characteristics is performed in a charging station, the environment of perfbrming the comparing process is more stable than in the electric vehicle. In other word, the data of the comparing process obtained in the charging station is more reliable and accurate. In accordance with the present invention, the battery pack provider can check the statuses of all interchangeable battery modules 130 in the battery management apparatus 100 whenever the charging operation is performed. In case that the interchangeable battery module 130 is seriously degraded to cause the mileage reduction, the interchangeable battery module 130 is replaced with a new one. Consequently, the battery pack provider can provide good leasing service.

From the above descriptions, the present invention provides a battery management apparatus. A memory circuit is independently included in a battery management unit of an interchangeable battery module. The memory circuit is only accessible and powered by a battery pack management unit. In case that the interchangeable battery module has a fault event, the battery operation data stored in the memory circuit will not be adversely affected by the generated surge current. Even if one of the interchangeable battery modules has a malfunction, the battery pack provider can operate the battery pack management unit to read the battery operation data from the memory circuit through a memory I/O connector. According to the battery operation data, the causes of the fault event of the interchangeable battery module can be realized. Moreover, while the battery management apparatus is being charged, the state of health can be calculated according to the result of comparing the present electrical characteristics with the previous electrical characteristics. In comparison with the conventional technology, it is not necessary to download associated data from the battery pack management unit or the electronic control unit. Since the testing process is simplified, the battery management apparatus is industrially valuable and patentable according to the law.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A battery management apparatus, comprising:
   at least one interchangeable battery module, wherein each interchangeable battery module comprises:
      a battery management unit comprising a voltage measurement circuit, a memory circuit and an isolation circuit, wherein the battery management unit is divided into a first section and a second section, the voltage measurement circuit and the isolation circuit are included in the first section, and the memory circuit is included in the second section, the isolation circuit is arranged between the battery pack management unit and the voltage measurement circuit, the voltage measurement circuit and the memory circuit are segregated and insulated from each other;
      a relay configuring for switching an internal circuit of the interchangeable battery module; and
      a battery cell package connected with the battery management unit, wherein the battery cell package is a power source of the battery management apparatus; and
   a battery pack management unit connected with the voltage measurement circuit of the at least one interchangeable battery module,
   wherein the voltage measurement circuit is powered by the battery cell package, and the voltage measurement circuit issues a voltage information to the battery pack management unit, wherein a battery operation data is stored in the memory circuit, and the memory circuit is only accessible by the battery pack management unit through a memory input/output connector.

2. The battery management apparatus according to claim 1, wherein the memory circuit is powered by a low voltage source of the battery pack management unit through the memory input/output connector.

3. The battery management apparatus according to claim 1, wherein the memory circuit is a non-volatile memory circuit.

4. The battery management apparatus according to claim 1, wherein battery cell package comprises plural battery cells.

5. The battery management apparatus according to claim 1, wherein when the battery pack management unit is connected with a charging system to perform a charging operation, the charging system reads the battery operation data from the memory circuit through the battery pack management unit, wherein while the charging operation is being performed, a status of the at least one interchangeable battery module is analyzed by the charging system according to a result of comparing present electrical characteristics with previous electrical characteristics.

6. The battery management apparatus according to claim 1, wherein when the battery management apparatus is used in an electric vehicle and the battery pack management unit is connected with an electric control unit of the electric vehicle, the electric control unit reads the battery operation data from the memory circuit through the battery pack management unit.

* * * * *